United States Patent [19]

Rellick

[11] Patent Number: 4,462,827

[45] Date of Patent: Jul. 31, 1984

[54] THICK FILM SILVER METALLIZATION COMPOSITION

[75] Inventor: Joseph R. Rellick, Wilmington, Del.

[73] Assignee: E. I. Du Pont de Nemours and Company, Wilmington, Del.

[21] Appl. No.: 442,954

[22] Filed: Nov. 19, 1982

[51] Int. Cl.³ .............................................. H01B 1/02
[52] U.S. Cl. .................................... 106/1.19; 252/514
[58] Field of Search ............................ 106/1.18, 1.19; 252/514

[56] References Cited

U.S. PATENT DOCUMENTS 4,032,752  6/1977  Ohmura et al. ...................... 252/514
4,219,448  8/1980  Ross .................................... 106/1.19
4,318,830  3/1982  Horowitz ............................ 252/519

*Primary Examiner*—Lorenzo B. Hayes

[57] ABSTRACT

Paste composition for metal surface metallization containing 65 to 95% by weight silver and 5 to 35% by weight cadmium/antimony alloy dispersed in a liquid vehicle.

4 Claims, No Drawings

THICK FILM SILVER METALLIZATION COMPOSITION

DESCRIPTION

1. Technical Field

This invention relates to thick film paste compositions. More specifically, it refers to a composition containing a mixture of fine particles of silver and an alloy of cadmium and antimony for use as a metallization on metal surfaces.

2. Background Art

Because of the high cost of silver, it is desirable to limit its use to those parts of an article where its unique combination of properties is needed. A wire bonding pad is one example of a device which may employ relatively large quantities of silver.

Screen printing of thick film paste compositions can produce fired films in the range of 0.01 to 0.04 mm thickness and as small as 0.2 to 0.5 mm diameter without much difficulty. However, available thick film silver compositions are generally intended for firing on ceramic substrates to form conductor lines, wire bonding pads or solderable pads for lead attachments. They do not produce functional metallizations when fired on metal substrates, because of adherence problems. A composition for connector contact metallizations must adhere well to a range of copper-base metal substrates without expensive substrate cleaning or the use of corrosive fluxes and it must produce a good electrical contact to the underlying metal. A need exists for such a thick film silver composition.

SUMMARY OF THE INVENTION

I have discovered specific thick film silver compositions for producing adherent, low contact resistance metallizations on metal substrates. The compositions are comprised of finely divided inorganic powder dispersed in an inert liquid vehicle. The inorganic powder comprises:

(A) 65 to 95% by weight of the inorganic solids of silver, and (B) 5 to 35% by weight of the inorganic solids of cadmium/antimony (Cd/Sb) alloy.

The proportion of inorganic powder to vehicle is a matter of choice, depending on the desired viscosity, but normally to make a printable paste there is 60–95% by weight inorganic powder and 5–40% by weight vehicle.

DETAILED DESCRIPTION OF THE INVENTION

My compositions consist of finely divided silver particles plus finely divided particles of an alloy of cadmium and antimony (Cd/Sb) dispersed in an inert liquid vehicle. The term finely divided is taken to mean that substantially all of the solid material is present as powder particles with the largest dimension less than 10 microns. Such powders results in compositions producing smooth, well resolved prints. For uses not requiring fine resolution or for application techniques other than screen printing, such as syringe dispensing or the like, larger particles could be used. The vehicle is present only for convenience of powder placement, and other application techniques involving dispensing and placement on the substrate of a dry mixture of the powder of this invention would be equally effective.

The silver in the composition should comprise between 65 and 95% by weight of inorganic solids and preferably 75 to 90% and more preferably between 82 and 88%.

The Cd/Sb should comprise between 5 and 35% by weight of inorgagnic solids and preferably between 10 and 25%, and more preferably between 12 and 18%. The cadmium/antimony alloy is made by melting together the desired amounts of cadmium and antimony in a refractory crucible in a nitrogen atmosphere to form a homogeneous liquid alloy. The liquid alloy is allowed to solidify and the resultant ingot is comminuted to a fine powder. Alternatively, the fine alloy powder could be produced by atomization of the homogeneous liquid alloy.

The antimony content of the cadmium/antimony alloy is 25 percent to 80 percent by weight and preferably 40 percent to 75 percent and more preferably 45–65 percent.

During firing of the printed compositions on a metal substrate, the Cd/Sb melts early in the firing cycle at about 350° C.–550° C. and as the temperature is raised further, the silver dissolves into the liquid forming an alloy among the constituents and resulting in a well sintered, coherent metallization. The liquid phase wets the metal substrate and partially dissolves the topmost substrate layer resulting in good adhesion and electrical contact to the substrate. Since some of the substrate is dissolved, the composition of the metallization after firing is not precisely the same as its composition before firing. The extent of this pickup of substrate constituents varies with the chemical composition of the substrate and the thickness of the metallization as well as the nature of the heating cycle. In general, substrate interaction can be minimized by use of relatively high melting substrates such as cupro-nickel, or by use of substrates coated with higher melting metal such as nickel. Rapid heating to the sintering temperature also aids in preventing melting of the substrate and the resulting sinking in of the metallization.

If the Cd/Sb content of the metallization is excessively high, substrate melting becomes excessive and the liquid phase formed early in the firing cycle flows out beyond the confines of the original printed area. Too low Cd/Sb content results in inadequate sintering and adhesion to the substrate. Those skilled in the art will see that the amount of Cd/Sb to be used must be adjusted depending on the heating cycle and the metal substrate used.

The addition of moderate amounts of other metals which do not alter the beneficial properties of these metallizations is permissible. In particular, it is believed that platinum or palladium could be added as in conventional thick film silver compositions to make the metallization more resistant to tarnishing, silver migration and leaching in solder.

The vehicle used in the thick film silver conductor compositions of the present invention can be any of those generally used in conventional silver conductor compositions including solutions or dispersions of resins, such as ethyl cellulose resin, polybutyl methacrylate, poly-α-methyl styrene or poly(ethylene vinyl acetate). Suitable solvents or dispersing mediums must be physically compatible with the resin and the resulting solution or dispersion must be chemically inert with respect to the other components of the silver metallization composition. Any one of various organic liquids, with or without thickening and/or stabilizing agents and/or other common additives (e.g., thixotropes and wetting agents) can be used as the carrier for the organic resin. Suitable organic liquids include aliphatic alcohols (e.g., 1-decanol), esters of such alcohols (e.g., acetates or propionates), glycol ethers (e.g., dibutyl carbitol), terpines (e.g., pine oil or terpineol), and di-alkyl phthalates (e.g., di-butyl phthalate or di-methyl phthalate). Preferred thixotropes include hydrogenated castor oil. Preferred wetting agents include soya lecithin, triethanolamine, and tributyl phosphate. Stabilizers can be added to prevent oxidation and degradation by acid by-products, i.e., to stabilize viscosity or to hel buffer the pH. Examples of suitable stabilizers include triethanolamine and 2,6-di-t-butyl-4-methyl phenol (e.g., Shell Ionol ®).

The Examples below where all percents are by weight further illustrate my invention.

EXAMPLE I 54.0 g of Fisher Cat. No. A846 lump atimony and 46.2 g of Alfa Cat. No. 00669 cadmium shot were melted together in a nitrogen atmosphere by heating to 650° C. in an alumina crucible. The resultant ingot was comminuted to a particle size less than 400 mesh. 0.75 Grams of the Cd/Sb powder were mixed with 4.5 grams of a silver powder in which substantially al of the silver is between 0.1 micron and 5 microns in size. A quantity of vehicle weighing about 1.2 grams was added to make a smooth, well dispersed paste. The vehicle composition was 5.2% ethyl cellulose, 11.6% terpineol, 52.8% dibutyl phthalate, and 30.4% dibutyl carbitol. The resultant paste was printed as thick film through a patterned 200 mesh stainless steel screen onto a piece of cold rolled CDA alloy 725 cupro-nickel and fired in a nitrogen atmosphere conveyor furnace to a peak temperature of 650° C. with 5 minutes at peak and total cycle time of 45 minutes. After firing, the silver alloy metallization was well adhered to the cupro-nickel substrate as determined by burnishing with a pencil eraser, probing with a sharp implement, and bending the substrate around a ⅛" diameter mandrel. The electrical resistance between the pad and the substrate was measured with a sensitive ohmmeter. No measurable contact resistance was found, indicating excellent electrical contact between metallization and substrate.

Showing A

A paste of 6.5 grams of the silver powder and 1.6 gram of vehicle was printed and fired as in Example I. After firing, the metallization was observed to be crumbly, porous and not well adhered to the cupro-nickel substrate, demonstrating the efficacy of Cd/Sb additions.

EXAMPLE II

A silver paste containing cadmium/antimony alloy was prepared in accordance with the procedures set forth in Example I.

The resultant paste was printed as a thick film pad through a patterned 325 mesh stainless steel screen onto a strip of CDA725 cupro-nickel alloy. The pad had surface dimensions of 0.6 mm by 1.1 mm. The printed portion was positioned under a focused induction heating coil. The assembly was blanketed with nitrogen to eliminate oxidation during the firing process. Energy was applied for 1.0 sec. The pad melted and securely adhered onto the substrate. Wire was easily joined to the pad using 0.025 mm diameter aluminum wire, commercially available ultrasonic wire bonding equipment and standard setup conditions.

Having thus described the invention, what is claimed and desired to be secured by Letters Patent is:

1. Thick film silver composition suitable for metal surface metallization comprising:
   65 to 95% by weight of silver particles, and
   5 to 35% by weight of particles of an alloy of cadmium and antimony having an antimony content of 25–80% by weight, the weights based on the total inorganic solids present, the solids being dispersed in a vehicle in a concentration sufficient to make a printable paste.

2. A composition according to claim 1 wherein the silver particle content is 75 to 90% by weight and the cadmium/antimony content is 10 to 25% by weight.

3. A composition according to claim 1 wherein the silver particle content is 82 to 88% by weight and the cadmium/antimony content is 12 to 18% by weight.

4. A screen printable paste comprising 60 to 95% by weight of the inorganic solids of claim 1 dispersed in 5 to 40% by weight of a vehicle.

* * * * *